United States Patent [19]

Reid

[11] Patent Number: 4,761,681

[45] Date of Patent: Aug. 2, 1988

[54] METHOD FOR FABRICATING A SEMICONDUCTOR CONTACT AND INTERCONNECT STRUCTURE USING ORIENTATION DEPENDENT ETCHING AND THERMOMIGRATION

[75] Inventor: Lee R. Reid, Plano, Tex.

[73] Assignee: Texas Instruments Incorporated, Dallas, Tex.

[21] Appl. No.: 415,783

[22] Filed: Sep. 8, 1982

[51] Int. Cl.[4] .................... H01L 23/48; H01L 25/06; H01L 25/08

[52] U.S. Cl. ....................................... 357/68; 357/75; 357/71

[58] Field of Search ........................ 357/55, 68, 71, 75

[56] References Cited

U.S. PATENT DOCUMENTS

| | | | |
|---|---|---|---|
| 3,577,037 | 5/1971 | DiPietro | 357/73 |
| 3,648,131 | 3/1972 | Stuby | 357/68 |
| 4,074,342 | 2/1978 | Honn et al. | 357/80 X |
| 4,127,863 | 11/1978 | Kurata | 357/51 |
| 4,246,595 | 1/1981 | Noyori et al. | 357/68 |

Primary Examiner—Andrew J. James
Assistant Examiner—S. V. Clark
Attorney, Agent, or Firm—William E. Hiller; N. Rhys Merrett; Melvin Sharp

[57] ABSTRACT

A method for fabricating a semiconductor device and the semiconductor device so fabricated, wherein the method includes the steps of forming a mesa upon one side of a semiconductor surface and then forming a conduction path from the mesa extending through the slice to the opposite side of the semiconductor substrate. Aluminum/silicon alloy droplets are deposited on the first side and form a liquid eutectic which extends to the opposite side by providing a thermal gradient across the slice causing thermomigration of the liquid eutectic. An electrical circuit is then formed on the opposite side and electrically connected to the metal conductor extending through the substrate as formed by the thermomigration of the liquid eutectic. A semiconductor structure is also described that includes an elevated surface upon the first side of a semiconductor substrate and an indentation in the other side, also the combination of two or more such substrates arranged in a stacked configuration. The elevated surface has an electrically conductive layer thereon which is connected to an electrically conductive material extending from the elevated surface to the indentation in the opposite side of the semiconductor substrate. At least one electrical circuit element is located on the opposite side of the semiconductor substrate and electrically connected to said conductive material upon the opposite side of the substrate.

4 Claims, 4 Drawing Sheets

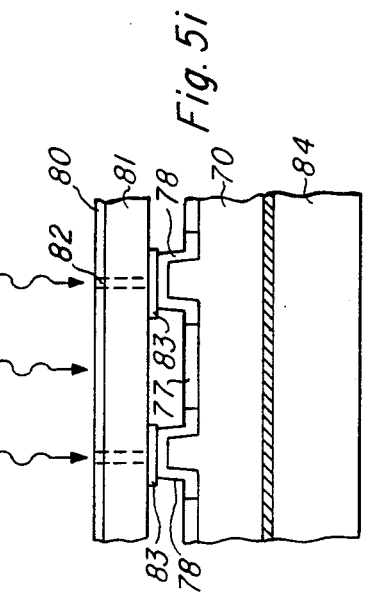
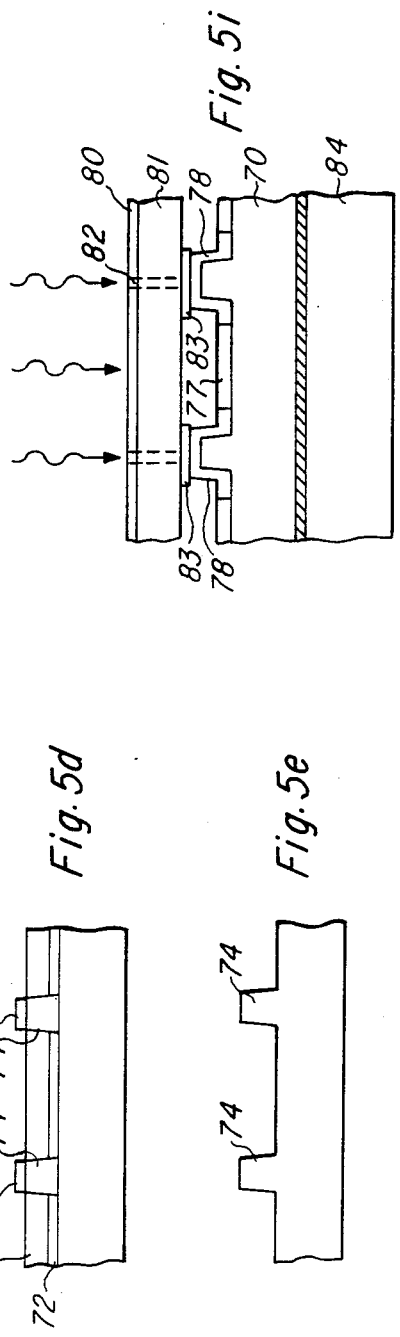
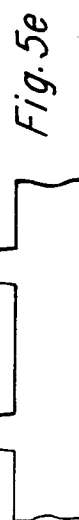

METHOD FOR FABRICATING A SEMICONDUCTOR CONTACT AND INTERCONNECT STRUCTURE USING ORIENTATION DEPENDENT ETCHING AND THERMOMIGRATION

SUMMARY OF THE INVENTION

In accordance with the present invention, a method for fabricating a semiconductor device is provided that includes the steps of forming a mesa on a first side of the semiconductor substrate and forming a conduction path in the mesa extending to the opposite side of the semiconductor device. Aluminum/silicon alloy droplets are deposited on the first side of the semiconductor slice. The semiconductor slice is then heated, creating a thermal gradient across the slice. This forms a molten alloy which migrates through the slice to form an electrical conduction path connecting both sides of the semiconductor substrate. At least one electrical circuit element is then formed on the opposite side of the semiconductor substrate and electrically connected to the metal conductive path on the opposite side of the semiconductor substrate.

In a further embodiment, a semiconductor substrate is disclosed which includes an elevated surface upon a first side of the semiconductor substrate. An electrically conductive material extending from the elevated surface of the first side of the semiconductor substrate to the opposite side is also provided. An electrical circuit is fabricated on the opposite side of the semiconductor substrate and electrically connected to the electrically conductive material extending through the semiconductor substrate. In a preferred embodiment this electrically conductive material is aluminum.

RELATED APPLICATIONS

The following applications are related to the present application: U.S. patent application Ser. No. 384,453 filed June 3, 1982 entitled "Solid State Multiprobe Testing Apparatus"; U.S. patent application Ser. No. 384,454 filed June 3, 1982 entitled "Solid State Interconnection System for Three Dimensional Integrated Circuit Structures; U.S. patent application Ser. No. 384,378 filed June 3, 1982, now abandoned, entitled "Interconnection of Surfaces For Semiconductor Devices"; U.S. patent application Ser. No. 384,451 filed June 3, 1982 entitled "Solid State Three Dimensional Semiconductor Memory Array"; U.S. patent application Ser. No. 415,787 filed Sept. 8, 1982 entitled "Method and Structure For Packaging Focal Plane Imagers and Signal Processing Circuits"; and U.S. patent application Ser. No. 416,396 filed Sept. 8, 1982 entitled "Direct Connection of Image Array to Processing Circuitry".

BACKGROUND OF THE INVENTION

1. Field of the Invention

This invention relates to image array circuitry and more specifically to the structure of the mage plane circuitry with the supporting circuitry on silicon substrates.

2. Description of the Prior Art

Focal plane arrays such as an infrared focal plane array are normally implemented using an array of detection elements on some substrate surfaces that are bonded electrically to support circuitry surrounding the array itself. The number of substrates surrounding the image array is usually determined by the number of detection elements on the image array itself. Since the support circuitry must be physically located adjacent to the image array itself, the area around the array must be structured to support this additional circuitry. This, in turn, acts as a limit to the size of the focal plane array itself.

It is the object of this invention to provide a structure that allows for the support circuitry to be formed as a three dimensional structure allowing for a greater area to be provided for the focal plane array itself and to require a smaller cold finger to cool the assembly.

BRIEF DESCRIPTION OF THE DRAWINGS

The novel features believed characteristic of this invention are set forth in the appended claims. The invention itself, however, as well as other features and advantages thereof will be best understood by reference to the detailed description which follows in conjunction with the accompanying drawings:

FIG. 5a is the cross-sectional view of a silicon slice.

FIG. 5b is a cross-sectional view of a silicon slice with an oxide defined surface.

FIG. 5c is a cross-sectional view of a silicon slice with mesas grown in the oxide formed areas.

FIG. 5d is a cross-sectional view of a silicon slice with the mesas formed together with an oxide covering the top portion of the mesas.

FIG. 5e is a cross-sectional veiw of a silicon slice with the mesas completely formed and exposed.

FIG. 5f is a cross-sectional view of a silicon slice with the mesas formed and protected by an oxide coating.

FIG. 5g is a cross-sectional view of the silicon slice with the mesas formed with circuitry fabricated between the mesas.

FIG. 5h is a cross-sectional view of a silicon slice with circuitry upon the surface electrically interconnected to metallized areas located on the surface of the mesas.

FIG. 5i is a cross-sectional view of the focal plane array positioned on top of a silicon slice which in turn is positioned on top of the cold finger.

DESCRIPTION OF THE INVENTION

Figure 1:
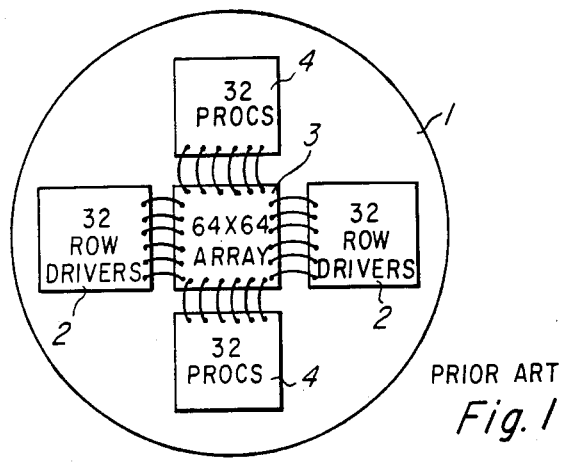
FIG. 1 is the top view of an image array with the supporting circuitry located on a cold finger.

The imager structure normally includes an array of photosensitive cells that are connected to several support circuits. FIG. 1 illustrates the structure of an infrared focal plane array connected with several support circuits on top of a cold finger 1. The cold finger 1 provides cooling for the infrared focal plane array for increased sensitivity of the array to detected infrared radiation. The structure in FIG. 1 is known in the prior art and implemented in current infrared imagers. Referring to FIG. 1, an infrared focal plane array 3 is located in the center of the cold finger 1. This particular array 3 contains a matrix of 64×64 infrared detection cells. These cells are addressed by rows and columns. The rows are addressed by one of the 32 row drivers 2 that are located beside the infrared focal plane array 3 on cold finger 1 as shown. These row drivers 2 are physically interconnected to the infrared focal plane array 3 by wires as shown. The wiring interconnect allows the row drivers 2 to individually address rows on the infrared focal plane array 3. The columns on the infrared focal plane array 3 are addressed by one of the two signal processors 4 located on the cold finger 1. The purpose of the signal processors 4 is to address and receive the information from each of the infrared sensing elements in the infrared focal plane array 3 and convert this information into digital signals to be transmitted to circuitry elsewhere. It is often customary to take the digital words representing the contents of the focal plane array image and to convert this image into a picture for display on a cathode ray tube for viewing by an observer. In the structure shown in FIG. 1, the signal processors 4 must also be individually wire bonded to the focal plane array 3 in a manner similar to that of the row drivers 2.

Figure 2:
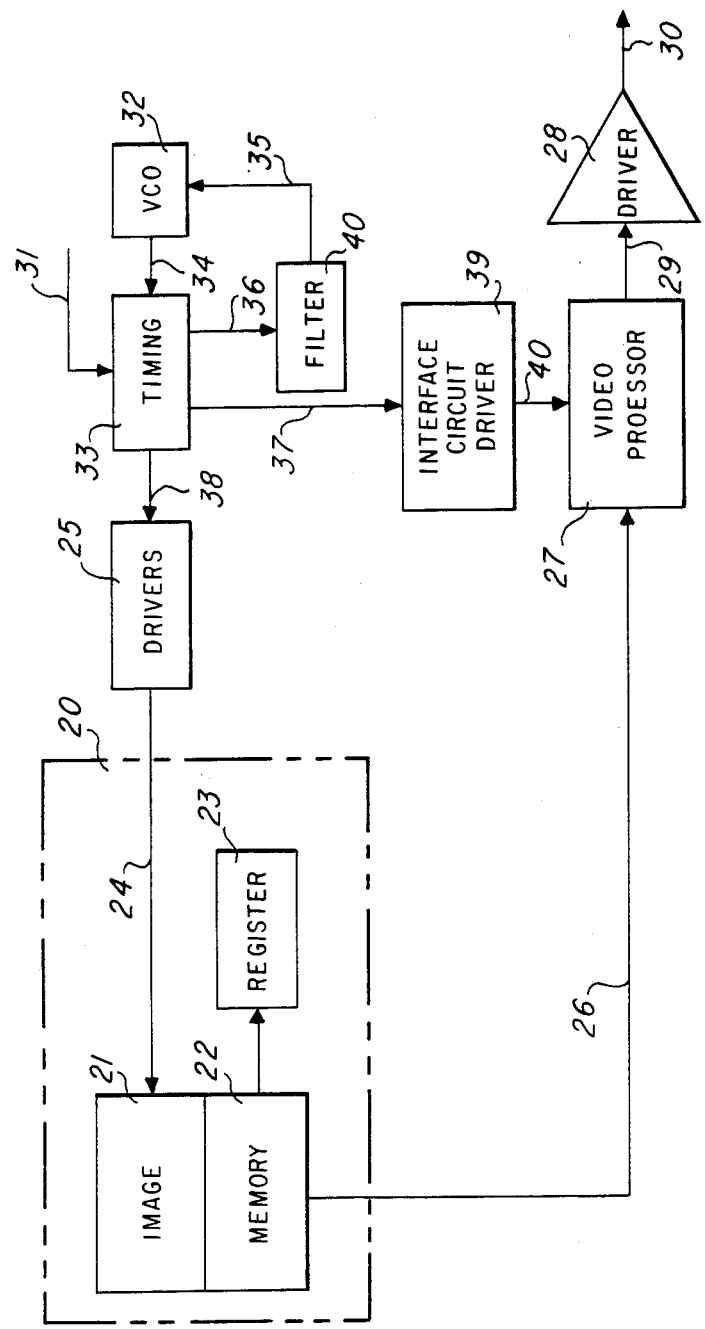
FIG. 2 is a block diagram of the image array and supporting circuitry.

The infrared focal plane array and supporting circuitry are illustrated in a block diagram in FIG. 2. This specific block diagram represents merely a representative block diagram of an infrared focal plane array system. The actual focal plane array is shown as a silicon chip 20. The image array 21 contains the matric of infrared sensitive elements. The image received by these elements is transferred to another similar array 22, which stores the information from the image array 21 and outputs this information by a line 26 to the video processor 27 upon command of the video processor. In typical applications the image array 21 will contain 390 pixels by 292 pixels, and the memory array will likewise be 390 pixels by 292 pixels. The purpose of the serial register 23 is to read data out of the memory half of the CCD imager 22 and send it to the video processor 27. The rows of the image array 21 are addressed by the line drivers 25 over line 24. The timing for this circuit originates in a phase locked loop circuit in block 33 which is connected by line 36 to a loop filter 40 which is fed back via line 35 into a variable oscillator 32 such as the component available as part No. SN 74327 from Texas Instruments Incorporated of Dallas, Tex., which provides the initial timing on line 34 to phase locked loop timing circuit 33. An external synchronization signal on line 31 may also be provided to the timing circuit. The timing is also provided by a line 37 to an interface circuit driver 39 that interfaces directly by line 40 to the video processor 27. Again, the purpose of the video processor 27 is to read the image in the memory array 22 and convert this information as input thereto on line 26 into a video signal that is output on line 29 and interfaced to external circuitry by driver 28 on to line 30. It is the object of this present invention to provide a structure that allows at least a portion of the circuitry contained in FIG. 2 to be physically adjacent to the actual infrared image array.

Figure 3:
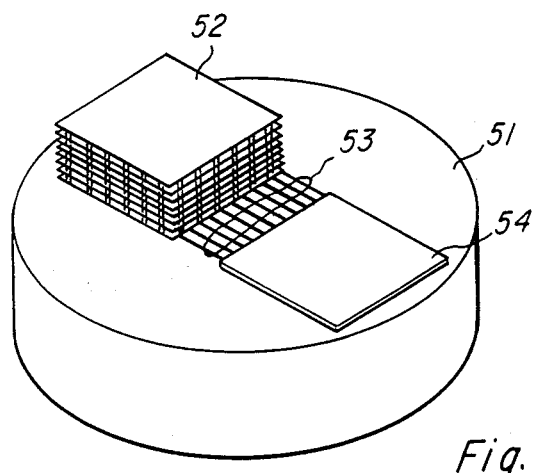
FIG. 3 is an isometric view of an image array and supporting circuitry structure located on a cold finger.

FIG. 3 illustrates one structure that would allow the support circuitry to be adjacent to the image array located upon a cold finger 51. The timing circuitry, signal processor and driving circuitry are located in the stack of silicon chips 52 that are connected by wiring 53 to the imager array 54. This arangement provides surface area savings on the cold finger 51 by use of the stacking of the support circuitry as opposed to the layout of the support circuitry with the image array in FIG. 1.

Figure 4:
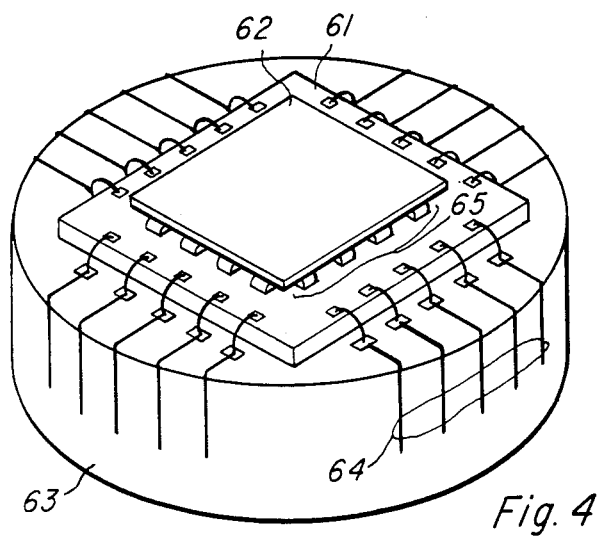
FIG. 4 is an isometric view of an alternate physical structure of the detector array and supporting circuitry.

In another embodiment the support circuitry for the image array may be located on a single silicon chip located beneath the infrared focal plane array as shown in FIG. 4. The cold finger 63 contains the single silicon chip 61. On top of the silicon chip 61 is the infrared focal plane array 62. In this instance, the infrared focal plane array chip 62 is connected by a series of mesas 65 to the silicon chip 61. Silicon chip 61 is then connectd to external circuitry by wiring 64 located on the surface of the cold finger 63. The physical structure of the silicon chips such as the chip 61 in FIG. 4 and the stacked structure 52 in FIG. 3 utilize mesas as formed on the silicon chip. One method of constructing these mesas is described in U.S. patent application Ser. No. 384,454 filed June 3, 1982, entitled "Solid State Interconnection System for Three Dimensional Integrated Circuit Structures". That application describes a technique for forming mesas using orientation dependent etching (ODE) of the silicon surface. A second method of forming mesas is orientation dependent deposition (ODD) as illustrated in FIGS. 5a-5i. FIG. 5a illustrates a cross section of a slice of silicon 70 in a 111 orientation. FIG. 5b illustrates an oxide defined mesa base deposited on top of the silicon 70. The oxide layer 72 defines open areas 71 which will become the respective bases of the mesas. FIG. 5c illustrates the growth of the mesas. This growth is accomplished by vapor phase epitaxy for the simultaneous growth of the epitaxial mesas 74 and polysilicon layers 73. The polysilicon layers 73 comprise a multiple crystalline silicon layer deposited on top of the oxide regions 72. The epitaxial growth, however, is a single crystal silicon growth based on the silicon slice 70. The simultaneous growth of epitaxial single crystal silicon and polysilicon occurs when the vapor phase comes in contact with the single crystal substrate 70 and the oxide layer 72. FIG. 5d illustrates the addition of a top layer of oxide 75 on top of the epitaxially grown mesas 74. FIG. 5e illustrates the etching of the polysilicon 73 from the slice 70 and the removal of the oxide layers 72 and 75. It should be noted that if a polysilicon selective etch is used, the oxide mesa covers 75 illustrated in FIG. 5d may not be required. FIG. 5f illustrates the covering of the mesas 74 with oxide 76 to protect the mesas during the formation of circuitry on the silicon surface. FIG. 5g illustrates the formation of the circuits 77 on the surface of the silicon chip 70. FIG. 5h illustrates the formation of metal contacts 78 on the surface of the mesas 74 and the remaining circuitry 77 on the surface of the silicon chip 70, the oxide 76 having been removed after the circuitry 77 has been formed, but prior to the formation of the metal contacts 78. FIG. 5i illustrates the three-dimensional interconnection of the infrared focal plane array 80 and 81 interconnected to the silicon circuitry on the silicon slice 70 located above the cold finger 84. The infrared focal plane array surface 80 is interconnected by interconnection leads 82 to metallized surfaces 83 on the base of the focal plane array 81. These metal surfaces further interconnect to the metallization 78 on the mesas of the silicon slice 70. These metallizations 78 of the mesas are interconnected to the circuitry 77 on the surface of slice 70. The slice 70 is located above the cold finger 84. The cold finger 84 provides cooling to the infrared focal plane 81 through the silicon slice 70 and the metallized areas 78 and 83. A thermal conducting substance may be injected between the silicon substrate 70 and the detector array 81 to increase thermal cooling of the detector array if necessary.

Figure 6:
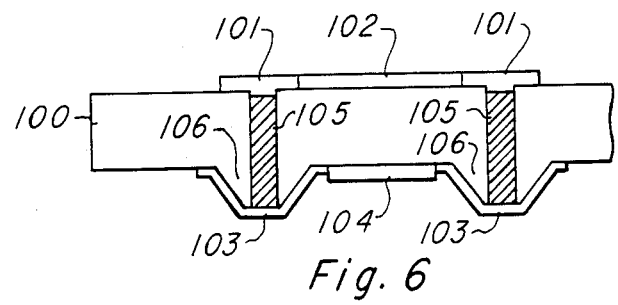
FIG. 6 is a cross-sectional veiw of a silicon slice with mesas connected to circuitry on both surfaces.

The interconnection between the two surfaces of a silicon chip or wafer is described in U.S. patent application Ser. No. 384,378 filed June 3, 1982, now abandoned entitled "Interconnection of Surfaces for Semiconductor Devices" herein incorporated by reference. This application describes the formation of a hole through the silicon wafer using orientation dependent etching. Other methods of forming holes through the silicon wafers are described in the paper "Forming Electrical Interconnections Through Semiconductor Wafers" by T. R. Anthony published in the *Journal of Applied Physics*, Vol. 52, No. 8, August 1978, pgs. 5340–5349. This paper describes several techniques for forming holes through the semiconducter wafer. Another paper entitled "Silicon as a Mechanical Material" by Kirk E. Peterson, published in *The Proceedings of the I.E.E.E.*, No. 5, May 1982. Pages 420–457 discusses many mechanical properties of silicon material. In this article, a technique called thermomigration is described that provides for the formation of conductor material through the silicon slice to interconnect the two surfaces of a wafer. The technique of forming holes in silicon wafers using laser drilling or similar techniques to form parallel holes in the silicon wafer together with thermomigration may be used to form these interconnects. FIG. 6 illustrates how these interconnections can be utilized with the mesas formed by orientation dependent etching or orientation dependent deposition to provide for a silicon wafer with circuitry formed on both sides that is interconnected. Referring to FIG. 6, the silicon wafer 100 contains circuitry 102 implemented on the top side of the silicon wafer 100 surface that is connected to metallized layers 101. These metallized layers 101 are electrically connected to the conductors 105 formed by thermomigration. These conductors 105 are also interconnected electrically to the metallized areas 103 on mesas 106. The metallized areas 103 are also interconnected to circuitry 104 formed on the bottom surface of the silicon wafer 100. This type of structure not only provides the interconnection of circuits 102 and 104, but also provides for the interconnection of the silicon wafer 100 with other silicon wafers. In this manner the stack structure 52 illustrated in FIG. 3 may be formed.

Figure 7:
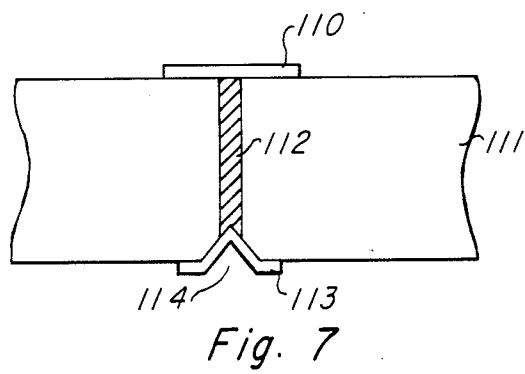
FIG. 7 is a cross-sectional view of a silicon slice with an orientation dependent etched indentation formed together with a thermomigration interconnection between surfaces.

FIG. 7 illustrates a further embodiment using thermomigration and orientation dependent etching to form an interconnection structure in a silicon wafer. The n-type silicon wafer 111 contains a metallized interconnection 112 that has been formed by thermomigration using an aluminum silicon alloy. The area 114 was formed by using an orientation dependent etch. This area is covered with a metallized layer 113 to provide interconnection to either electrical circuits on that substrate or to exterior probe interconnections. The metallized layer 110 formed on top of the interconnect 112 is fabricated for interconnection to any circuitry that may be fabricated on that surface of the semiconductor substrate 111.

Figure 8:
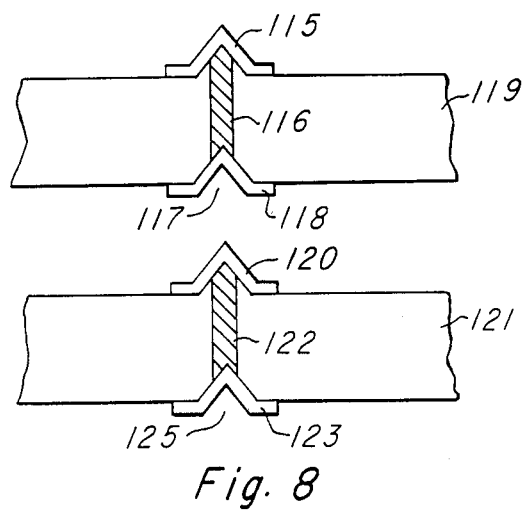
FIG. 8 is a cross-sectional view of two silicon slices, both with thermomigration formed interconnections together with orientation dependent etched indentations and mesas on the opposite surfaces thereof.

FIG. 8 illustrates the interconnection of two substrates formed in a manner described for FIG. 7. In FIG. 8 the two substrates 119 and 121 both have elevated areas formed that are covered with metallized layers 115 and 120, respectively. These elevated layers are formed by orientation dependent etching as previously discussed. The interconnection in the substrates between the surfaces such as 116 for substrate 119 and 122 for substrate 121 are formed by thermomigration of an aluminum silicon alloy. The orientation dependent etch technique has also been used to form indentations in the substrates such as area 117 for substrate 119 and 125 for substrate 121. These areas have been covered by metal coatings 118 and 123, respectively. This combination of orientation dependent etching with the metallized coating and thermomigration interconnection provides for the mating of two silicon wafers 119 and 121 in the manner shown by joining the orientation dependent etched protruding layer of substrate 121 with metal coating 120 against the orientation dependent etched indentation area 117 with metal coating 118 of substrate 119. In this manner, the substrates may be stacked on top of each other providing electrical interconnections between the substrate surfaces themselves and between the surface of one substrate and the surface of another substrate.

I claim:

1. A semiconductor device comprising:
    a substrate of semiconductor material having first and second major surfaces;
    at least one mesa of semiconductor material integral with the semiconductor material of said substrate and extending outwardly of said first major surface of said substrate to define a substantially level elevated surface spaced outwardly with respect to said first major surface of said substrate;
    an electrically conductive material forming an electrically conductive path through said substrate and extending to said first and second major surfaces and through said at least one mesa to said level elevated surface thereof so as to define a continuous electrical conductor;
    a first electrically conductive layer disposed on said level elevated surface of said mesa and electrically interconnected to said electrical conductor defined by said electrically conductive path through said substrate;
    a second electrically conductive layer disposed on said second major surface of said substrate electrically interconnected to said electrical conductor as defined by said electrically conductive path through said substrate; and
    first and second electrical circuit means respectively disposed on said first and second major surfaces of said substrate and electrically connected to said first and second electrically conductive layers respectively so as to be electrically interconnected with each other via said electrical conductor as defined by said electrically conductive path through said substrate.

2. A semiconductor device according to claim 1, wherein said continuous electrical conductor defined by said electrically conductive path through said substrate includes a metal.

3. A semiconductor device according to claim 2 wherein said metal is aluminum.

4. A semiconductor device structure comprising:
    a plurality of individual substrates of semiconductor material, each of said substrates having first and second major surfaces;

each of said substrates having an indentation formed therein and opening onto said first major surface thereof;

at least one elevated surface portion of semiconductor material integral with the semiconductor material of each of said substrates and extending outwardly of said second major surface of said substrate;

each of said substrates further having an electrically conductive path provided therethrough and extending to the bottom of the indentation opening onto said first major surface and through said elevated surface portion on said second major surface, said electrically conductive path defining a continuous electrical conductor extending through each of said substrates in registration with the indentation on said first major surface and said elevated surface portion on said second major surface of each said substrate;

a first electrically conductive layer lining the bottom of the indentation and electrically interconnected to said electrical conductor as defined by said electrically conductive path through each said substrate;

a second electrically conductive layer disposed on said elevated surface portion of said second major surface of each said substrate and electrically interconnected to said electrical conductor as defined by said electrically conductive path through each said substrate;

said plurality of substrates being arranged in stacked juxtaposition with each other such that said elevated surface portion and said second electrically conductive layer disposed thereon of one substrate is respectively received within the indentation in electrical contact with said first electrically conductive layer lining the bottom of the indentation of an adjacent substrate so as to electrically interconnect the first and second major surfaces of each of the substrates in said stack with each other; and electrical circuit means disposed on one or more major surfaces of said plurality of substrates included in said stack and electrically connected to the electrically conductive layer on the major surface corresponding thereto so as to be electrically interconnected with each other.

* * * * *